United States Patent
Chao et al.

(10) Patent No.: US 9,853,535 B2
(45) Date of Patent: Dec. 26, 2017

(54) EXTERNAL POWER SUPPLY AND SYSTEM CONNECTION DETECTION UNIT APPLIED THERETO

(71) Applicants: LITE-ON ELECTRONICS (GUANGZHOU) LIMITED, Guangzhou (CN); LITE-ON TECHNOLOGY CORPORATION, Taipei (TW)

(72) Inventors: Shan-Jen Chao, New Taipei (TW); Yeh Guan, Taipei County (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 219 days.

(21) Appl. No.: 14/987,922

(22) Filed: Jan. 5, 2016

(65) Prior Publication Data
US 2016/0268884 A1    Sep. 15, 2016

(30) Foreign Application Priority Data
Mar. 9, 2015 (CN) .......................... 2015 1 0103391

(51) Int. Cl.
*H02J 7/00* (2006.01)
*H02M 1/08* (2006.01)
(Continued)

(52) U.S. Cl.
CPC ............. *H02M 1/08* (2013.01); *H02J 7/0036* (2013.01); *H03H 7/40* (2013.01); *G01R 15/04* (2013.01);
(Continued)

(58) Field of Classification Search
None
See application file for complete search history.

(56) References Cited

U.S. PATENT DOCUMENTS

2006/0149977 A1   7/2006 Cooper
2007/0283175 A1   12/2007 Marinkovic et al.
(Continued)

FOREIGN PATENT DOCUMENTS

TW   200638331   11/2006
TW   I292865     1/2008
(Continued)

*Primary Examiner* — Long Nguyen
(74) *Attorney, Agent, or Firm* — Li & Cai Intellectual Property (USA) Office

(57) ABSTRACT

An external power supply and a system connection detection unit applied thereto are provided. For providing DC power, the external power supply separably connects with a positive input terminal and a negative input terminal of a system through a positive output terminal and a negative output terminal respectively. When the positive output terminal and the negative output terminal are respectively connected to the positive input terminal and the negative input terminal, a system detection terminal connects with a system connection terminal of the system, and a connection status signal generated by the system connection detection unit switches the operation of the external power supply from a deep sleeping mode to a normal operation mode. The system connection terminal is electrically connected to one of the positive input terminal and the negative input terminal through at least a first resistive element.

10 Claims, 7 Drawing Sheets

(51) Int. Cl.
*H03H 7/40* (2006.01)
*G01R 15/04* (2006.01)
*H02M 1/00* (2006.01)

(52) U.S. Cl.
CPC .............. *H02M 2001/0032* (2013.01); *H02M 2001/0035* (2013.01); *Y02B 70/16* (2013.01)

(56) References Cited

U.S. PATENT DOCUMENTS

| | | | | |
|---|---|---|---|---|
| 2013/0207455 A1* | 8/2013 | Doljack | ................ | H02J 7/0036 307/130 |
| 2014/0232355 A1* | 8/2014 | Masuda | ................ | B60L 3/0069 320/137 |

FOREIGN PATENT DOCUMENTS

| | | |
|---|---|---|
| TW | I337442 | 2/2011 |
| TW | M470448 U | 1/2014 |

\* cited by examiner

EXTERNAL POWER SUPPLY AND SYSTEM CONNECTION DETECTION UNIT APPLIED THERETO

BACKGROUND OF THE INVENTION

1. Field of the Invention

The instant disclosure relates to a power supply; in particular, to an external power supply and a system connection detection unit applied thereto.

2. Description of Related Art

Enhanced environmental awareness in recent years and global warming have forced saving energy to become one of the major policies of most countries in the world. For the purpose of power saving, the US Department of Energy has developed low-power specifications for all the information and electronic devices. For example, energy efficiency level V1 (Efficiency>88%, Power input<0.21 W at no load) is required for a external power supply. The European Union also has adopted the advanced power saving code CoC tier I (Efficiency>89%, Power input<0.25 W at no load) & tier II (Efficiency>89%, Power input<0.15 W at no load). Therefore, decreasing the power consumption of the external power supply has become a problem to be overcome at present for persons skilled in the art. Under the circumstance of continuing improved energy consumption requirements, the burst-mode control is not sufficient to meet the requirements of approaching extreme low power consumption of the converter. Therefore, the external power supply employing deep sleeping mode has become widely used.

As shown in FIG. 1, the deep sleeping mode makes the power supply unit (PSU) operate intermittently with a very long sleep time, so as to obtain very low input power consumption. The status SA indicates the voltage drop during sleeping, and when the voltage is lower than a certain degree, the status SA changes to the status SB to perform switching the power switches in order to increase the voltage. However, due to the time interval of intermittent work being too long, the output voltage increases greatly and decreases greatly. As such, the output voltage cannot be stable at the required DC voltage for the general system work. When the system is start-up (for example, a computer is power-on) which means the system loading is generated (at the time point T1), a current detection method is usually used to make the power supply start a normal operation mode when detecting the load current draw. Because of the unstable output voltage, if the computer without a battery uses this operation mode, the power supply would not recover the normal operation mode fast enough when the load draw happens, resulting in too low output voltage. As shown in FIG. 1, the voltage drop is quite large after the time point T1. It may cause the abnormal operation. Therefore, conventionally, the aforementioned mode is only applied to (or adapted for) the computer with a battery, such as a notebook computer.

SUMMARY OF THE INVENTION

The object of the instant disclosure is to provide an external power supply and a system connection detection unit applied thereto, for providing improvement over the prior art.

According to an embodiment of the instant disclosure, an external power supply is provided. The external power supply separably connects with a positive input terminal and a negative input terminal of the system through a positive output terminal and a negative output terminal respectively for providing power to the system and comprises a power supply unit and a system connection detection unit. The power supply unit is electrically connected to the positive output terminal and the negative output terminal. The system connection detection unit is electrically connected to the power supply unit for detecting the connecting status between the external power supply and the system, and has a system detection terminal. When the positive output terminal and the negative output terminal respectively connects to the positive input terminal and the negative input terminal the system detection terminal is used to connect with a system connection terminal of the system, wherein the system connection terminal is electrically connected to one of the positive input terminal and the negative input terminal through at least one first resistive element. The system connection detection unit detects the voltage of the system detection terminal and generates a connection status signal accordingly. The connection status signal generated by the system connection detection unit switches the operation of the external power supply from a deep sleeping mode to a normal operation mode when the positive output terminal and the negative output terminal are respectively connected to the positive input terminal and the negative input terminal of the system.

According to another embodiment of the instant disclosure, a system connection detection unit applied to an external power supply provided is electrically connected to a power supply unit of the external power supply for detecting the connecting status between the external power supply and a system. The external power supply separably connects with a positive input terminal and a negative input terminal of the system through a positive output terminal and a negative output terminal respectively for providing an electrical power to the system. The system connection detection unit comprises a system detection terminal, a power impedance matching circuit and a logic circuit. When the positive output terminal and the negative output terminal respectively connects to the positive input terminal and the negative input terminal, the system detection terminal is used to connect with a system connection terminal of the system, wherein the system connection terminal is electrically connected to one of the positive input terminal and the negative input terminal through at least one first resistive element. The power impedance matching circuit is electrically connected with the system detection terminal and generates a voltage detection signal according to the voltage of the system detection terminal. The logic circuit is electrically connected to the power impedance matching circuit and compares the voltage detection signal with a reference signal to generate a connection status signal which switches the operation of the external power supply from the deep sleeping mode to the normal operation mode when the positive output terminal and the negative output terminal are respectively connected to the positive input terminal and the negative input terminal of the system.

In summary, the power supply in this instant disclosure uses the impedance matching during the system connection terminal is connected to the system to obtain the voltage detection signal from the system. By means of the circuit feedback mechanism, the power supply also uses the voltage detection signal to determine whether the power source is connected to the system so as to control the power source to operate in the deep sleeping mode and the normal operation mode.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of an External Power Supply and a System Connection Detection Unit Applied Thereto]

Figure 2:
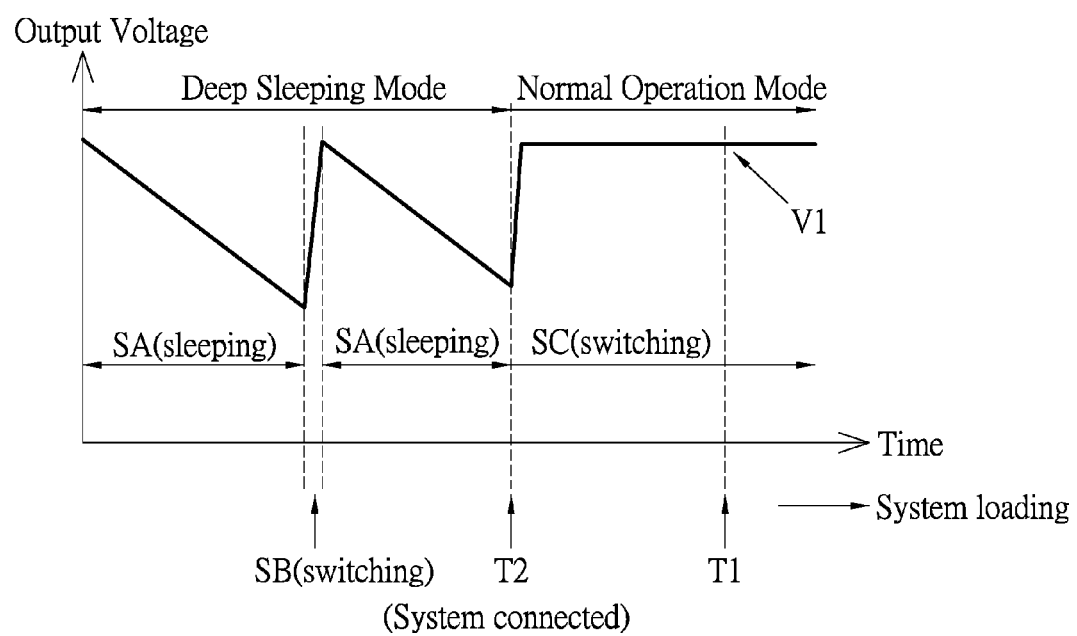
FIG. 2 shows a waveform diagram of an output voltage of an external power supply according to an embodiment of the instant disclosure.

The external power supply of this embodiment has a normal operation mode and a deep sleeping mode. The power consumption of the external power supply in the deep sleeping mode is less than that of the external power supply in the normal operation mode. Please refer to FIG. 2 showing a waveform diagram of an output voltage of an external power supply according to an embodiment of the instant disclosure. At first, the objective of the external power supply in this embodiment is described. Then, the circuits of the external power supply and the system connection detection unit are further described hereinafter. The external power supply enters the deep sleeping mode when no system is connected, so as to achieve extremely low input power consumption to comply with international energy rules. As shown in FIG. 2, the operation of external power supply switches between the status SA (sleeping) and the status SB (switching). When the external power supply is determined to be connected with the system (at the time point T2), the external power supply operating in deep sleeping mode returns to the normal operation mode (that is changing to status SC for continuously switching power), such that the output will be stable to a direct current voltage (outputting the voltage V1 normally). The abnormal operation problem due to the voltage drop of the output voltage can be solved. In other words, after the system loading has begun (after the time point T1), because the external power supply has been operating in normal operation mode, the output voltage will not drop greatly due to the system loading.

Figure 1:
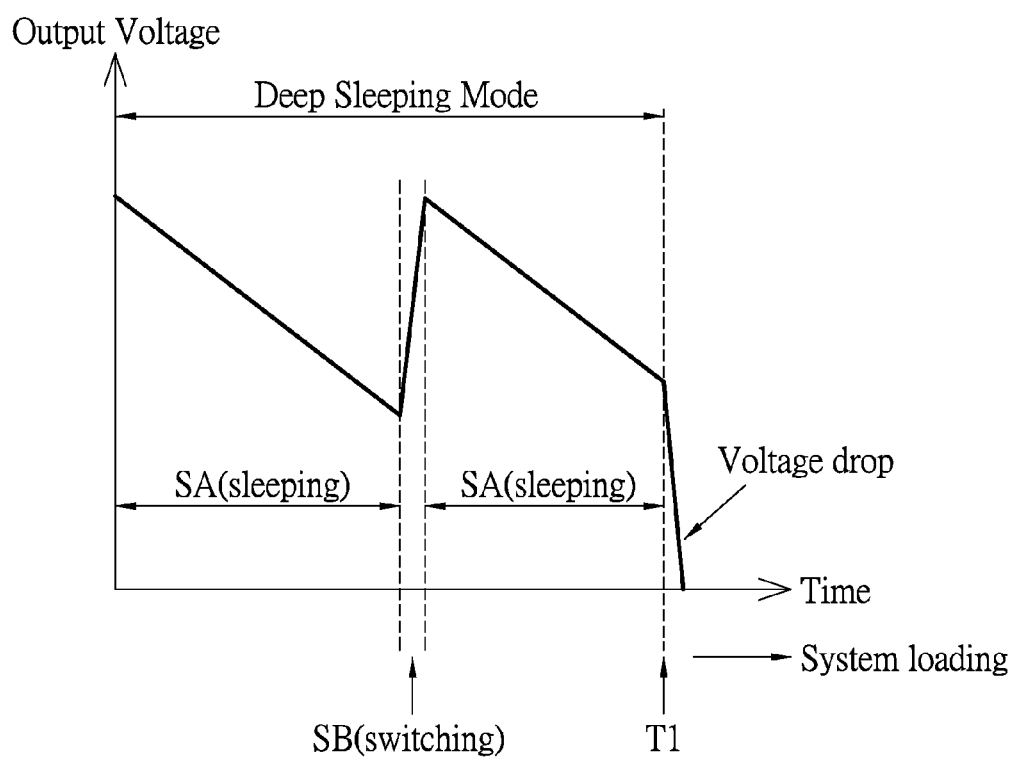
FIG. 1 shows a waveform diagram of an output voltage of a conventional power supply.

As mentioned in the related art, when using the prior art, the conventional deep sleeping mode is not adapted for a system without a battery (when the system is a computer system, the system can be a desktop computer system, for example), referring to FIG. 1. Therefore, the external power supply can only use burst-mode to achieve the 0.17-0.18 watt power consumption at no load. Relatively, when using the technique of the instant disclosure, the power consumption at no load can effectively be reduced by 65%, so as to reduce the power consumption to 0.06-0.07 watt, and it can comply with the code of CoC tier II (Eff.>89%, Pin<0.15 W at no load).

Figure 3:
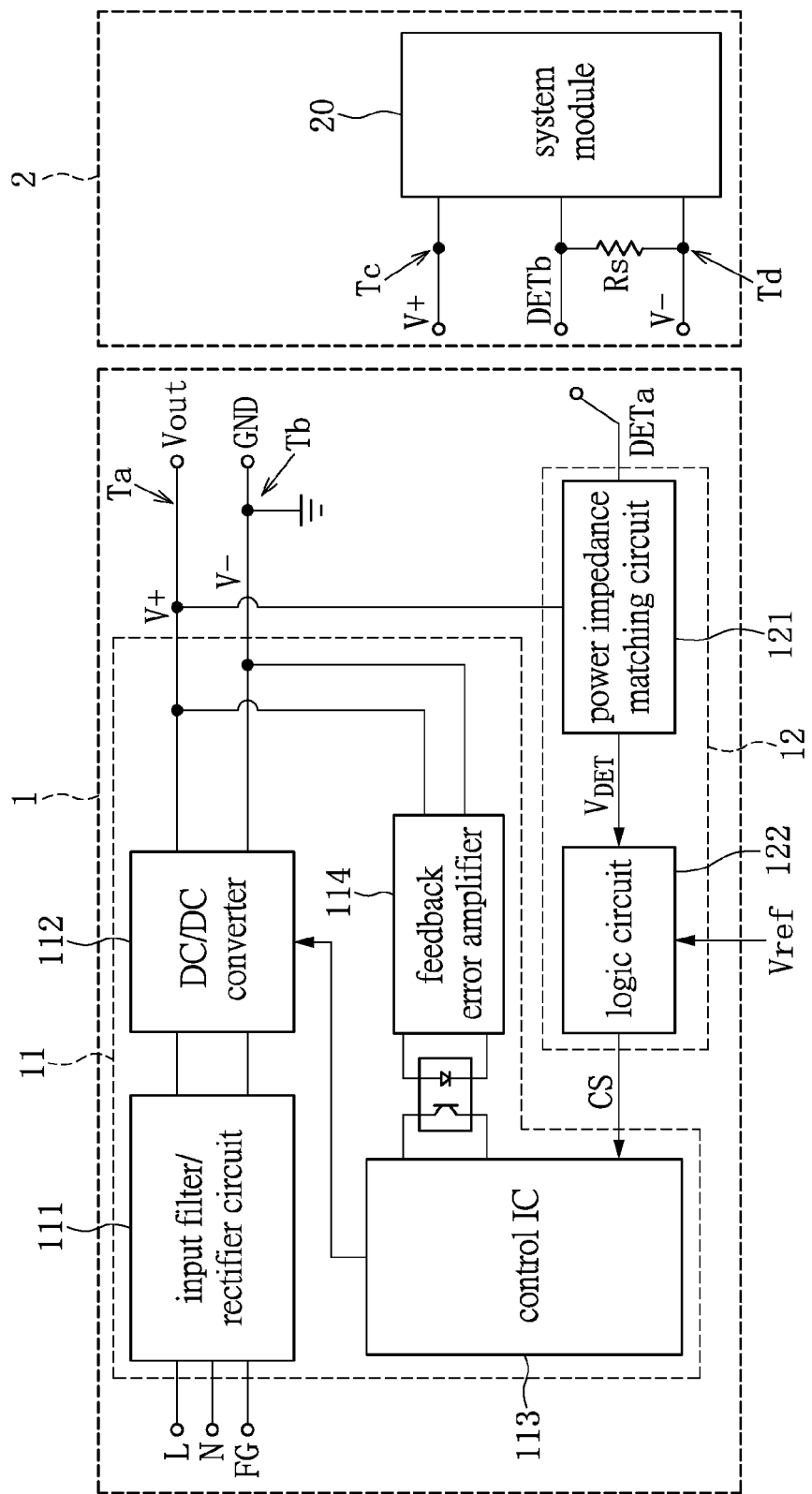
FIG. 3 shows a circuit block diagram of an external power supply and the connected system according to an embodiment of the instant disclosure.

Please refer to FIG. 3 showing a circuit block diagram of an external power supply and the connected system according to an embodiment of the instant disclosure. The external power supply 1 separately connects with a positive input terminal Tc and a negative input terminal Td of a system 2 through a positive output terminal Ta and a negative output terminal Tb respectively for providing power to the system 2. The external power supply 1 operates in the deep sleeping mode when the positive output terminal Ta and the negative output terminal Tb do not respectively connect with the positive input terminal Tc and the negative input terminal Td of the system 2. For example, considering the output voltage waveform shown in FIG. 2, before the time point T2, the positive output terminal Ta and the negative output terminal Tb of the external power supply 1 is not yet connected with the positive input terminal Tc and the negative input terminal Td of the system 2, such that the external power supply 1 operates in the deep sleeping mode. The status of the output voltage Vout of the external power supply 1 switches between the status SA and the status SB.

The external power supply 1 comprises a power supply unit 11 and a system connection detection unit 12. The power supply unit 11 is electrically connected to the positive output terminal Ta and the negative output terminal Tb. The power supply unit 11 converts an external power to a DC power. When the external power electrical power is an AC power, the power supply unit 11 generally comprises an input filter/rectifier circuit 111, a DC/DC converter 112, a control IC 113 and a feedback error amplifier 114. An artisan of ordinary skill in the art will appreciate the implementation manner of the power supply unit 11, thus there is no need to go into detail.

In FIG. 3, the external AC power transmits electrical power to the input filter/rectifier circuit 111 of the power supply unit 11 through the line wire L, the neutral wire N and the frame ground FG. However, the instant disclosure does not limit the connection between the power supply unit 11 and the external power, such as the AC power. The input filter/rectifier circuit 111 converts the AC power to DC power, wherein the input filter/rectifier circuit 111 usually comprises filter and rectifier components. The DC/DC converter 112 transmits the electrical power from the input filter/rectifier circuit 111 to the positive output terminal Ta and the negative output terminal Tb. The control IC 113 uses the feedback signal of the feedback error amplifier 114 to control the output voltage Vout outputted by the DC/DC converter 112.

The power supply unit 11 transmits the DC power to the system 2 when the positive output terminal Ta and the negative output terminal Tb respectively connect with the positive input terminal Tc and the negative input terminal Td. For example, considering the output voltage waveform shown in FIG. 2, the time point T2 represents that the positive output terminal Ta and the negative output terminal Tb are respectively connected with the positive input terminal Tc and the negative input terminal Td of the system 2. At the time point T2, the system does not connected (the system 2 has not connected yet). The time point T1 after the time point T2 represents that the system connecting has begun, and at this time the power supply unit 11 can transmit DC power to the system 2.

The system connection detection unit 12 is electrically connected to the power supply unit 11 for detecting the connecting status between the external power supply 1 and the system 2. The system connection detection unit 12 has a system detection terminal DETa. The system 2 has a system connection terminal DETb. This instant disclosure does not limit the type and kind of the system 2. In FIG. 3, the system 2 comprises a system module 20 connected with the positive input terminal Tc, the negative input terminal Td and the system connection terminal DETb. In regards to the type of applications of the system 2 (computer, TV or set-up box, and so on), the system 2 may have a different functional circuit, which is omitted in FIG. 3.

The connection between the external power supply 1 and the system 2 can be determined by the operation of the user. For example, the positive output terminal Ta, negative output terminal Tb and the system detection terminal DETa of the external power supply 1 can be arranged on a connector (a socket with three electrical contacts for example). The positive input terminal Tc, the negative input terminal Td and the system connection terminal DETb of the system 2 can also be arranged on another connector (a plug with three electrical contacts for example). The user can connect the connector of the system 2 to the connector of the external power supply 1 (connecting the plug of the system 2 to the socket of the external power supply 1), so as to achieve the power supplying circuit for the system 2.

In another embodiment, the connection between the external power supply 1 and the system 2 can be determined by a switching circuit or a switch. The connection between the external power supply 1 and the system 2 can be controlled by the switch. When the switch is turned on, the switch connects the positive output terminal Ta, the negative output terminal Tb and the system 2 detection terminal DETa respectively to the positive input terminal Tc, the negative input terminal Td and the system connection terminal DETb. When the switch is turned off, the switch disconnects the positive output terminal Ta from the positive input terminal Tc, disconnects the negative output terminal Tb from the negative input terminal Td, and disconnects the system detection terminal DETa from the system connection terminal DETb.

The circuit status after connecting the external power supply 1 with the system 2 is further described hereafter. When the positive output terminal Ta and the negative output terminal Tb respectively connects to the positive input terminal Tc and the negative input terminal Td, the system detection terminal DETa is used for connecting with the system connection terminal DETb of the system 2, wherein the system connection terminal DETb is electrically connected to one of the positive input terminal Tc and the negative input terminal Td through at least one first resistive element. In the embodiment shown in FIG. 3, the first resistive element is Rs, and the first resistive element Rs is connected to the negative input terminal Td of the system 2. The system connection terminal DETb is not connected with the positive input terminal Tc. In still another embodiment hereafter, the system connection terminal DETb is connected to the positive input terminal Tc of the system through the first resistive element Rs. However, this instant disclosure does not limit the connection between the system connection terminal DETb and the positive input terminal Tc or the negative input terminal Td. The system connection terminal DETb of the system 2 can use a resistance circuit with more than one resistor for connecting with one of the positive input terminal Tc and the negative input terminal Td. That is, the system connection terminal DETb of the system 2 connects with one of the positive input terminal Tc and the negative input terminal Td through the resistive element, such that the voltage variance of the system connection terminal DETb can be detected by the system detection terminal DETa when the system connection terminal DETb is connected with the system detection terminal DETa. In other words, the system connection terminal DETb of the system is used to feedback the input voltage status obtained by the system 2 to the external power supply 1 when the external power supply 1 is connected with the system 2, such that the external power supply 1 can leave the deep sleeping mode.

The system connection detection unit 12 detects the voltage of the system detection terminal DETa and generates a connection status signal CS accordingly. The connection status signal CS generated by the system connection detection unit 12 is transmitted to the power supply unit 11 when the positive output terminal Ta and the negative output terminal Tb are respectively connected to the positive input terminal Tc and the negative input terminal Td of the system 2 (at the same time the system connection terminal DETb is also connected to the system detection terminal DETa), such that the power supply unit 11 will change the operation status. Therefore, the operation of the external power supply 1 can be switched to the normal operation mode from the deep sleeping mode.

The system connection detection unit 12 comprises a power impedance matching circuit 121 and a logic circuit 122. The power impedance matching circuit 121 is electrically connected with the system detection terminal DETa, for generating a voltage detection signal $V_{DET}$ according to the voltage of the system detection terminal DETa. The logic circuit 122 is electrically connected to the power impedance matching circuit 121. The logic circuit 122 compares the voltage detection signal $V_{DET}$ with a reference signal Vref to generate the connection status signal CS, wherein the voltage of the reference signal Vref is between the voltage of the positive output terminal Ta and that of the negative output terminal Tb. According to practical requirements, the reference signal Vref is settable. In this embodiment, the reference signal Vref is used to detect the variance of the voltage detection signal $V_{DET}$ to determine whether the system connection terminal DETb and the system detection terminal DETa are connected or not.

The power impedance matching circuit 121 is used for impedance matching when the system connection terminal DETb and the system detection terminal DETa are connected. The power impedance matching circuit 121 has at least one second resistive element. The logic circuit 122 is used to perform logical judgment for the voltage detection signal $V_{DET}$ from the power impedance matching circuit 121, so as to determine whether the system 2 is connected to the external power supply 1. The embodiment for the power impedance matching circuit 121a and 121b the logic circuit 122a and 122b are described hereinafter.

Figure 4:
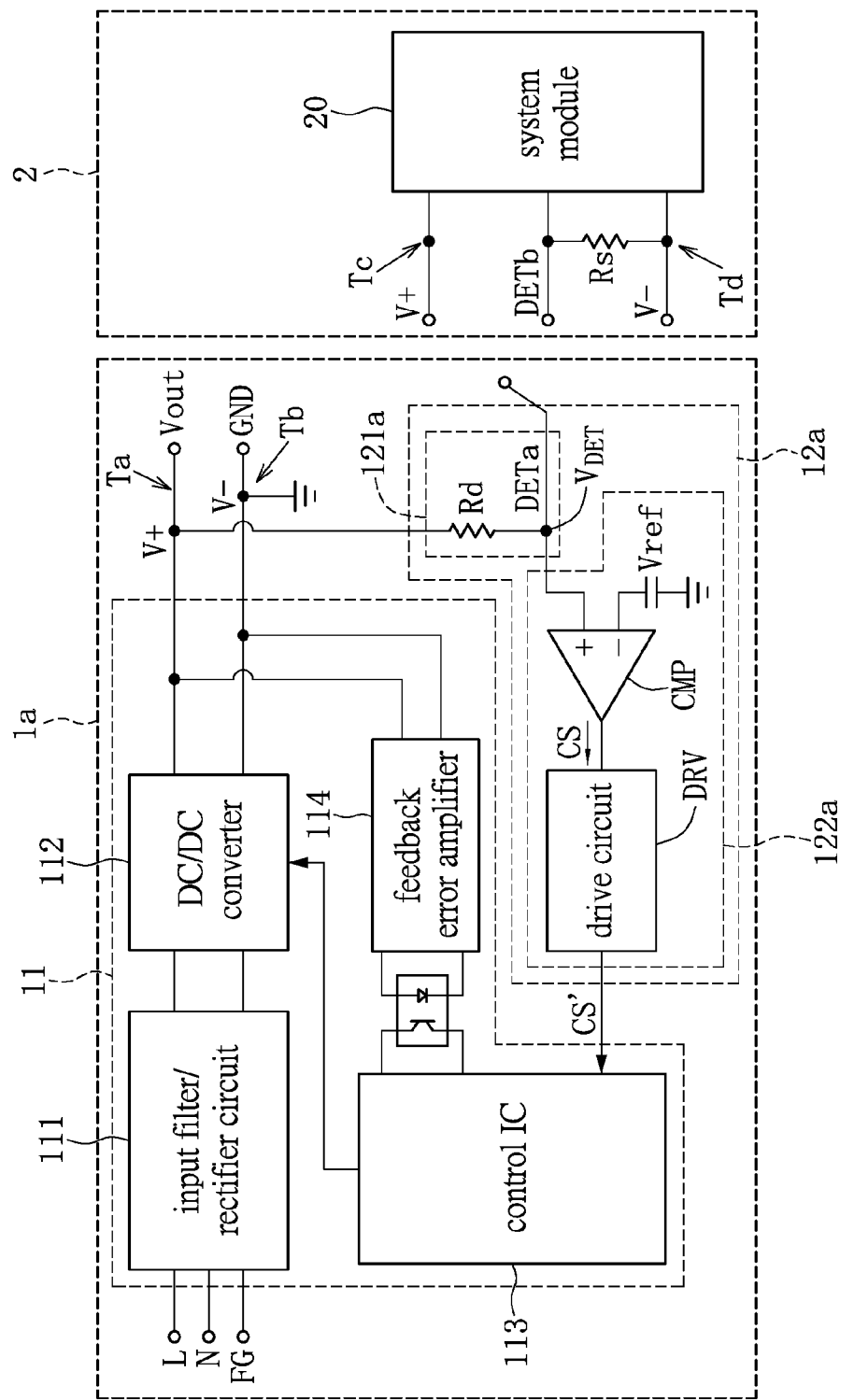
FIG. 4 shows a circuit block diagram of an external power supply and the connected system according to an embodiment of the instant disclosure.

Please refer to FIG. 4 showing a circuit block diagram of an external power supply and the connected system according to an embodiment of the instant disclosure. The power supply unit 11 of the external power supply 1a shown in FIG. 4 is the same as the power supply unit 11 of the external power supply 1 of FIG. 3. FIG. 4 further illustrates one embodiment of the system connection detection unit. The system connection detection unit 12a comprises a power impedance matching circuit 121a and a logic circuit 122a.

As shown in FIG. 4, the power impedance matching circuit 121a comprises a second resistive element Rd. The second resistive element Rd is connected between the system detection terminal DETa and the positive output terminal Ta. That is, the system detection terminal DETa is electrically connected to the positive output terminal Ta through the second resistive element Rd. The system connection terminal DETb is electrically connected to the negative input terminal Td of the system 2 through the first resistive element Rs.

However, this instant disclosure does not limit the power impedance matching circuit 121a to be connected to the positive output terminal Ta or the negative output terminal Tb. In this embodiment, the power impedance matching circuit 121a keeps the voltage status (V+) by using the second resistive element Rd when the system connection terminal DETb is not connected to the system detection terminal DETa (that is the external power supply 1a is not connected to the system). Therefore, when the external power supply 1 is not connected to the system 2, the voltage detection signal $V_{DET}$ will change periodically along with the output voltage Vout (which is the voltage V+ shown in FIG. 4), such as the voltage status before the time point T2 shown in FIG. 2. When the system connection terminal DETb is connected to the system detection terminal DETa, the voltage detection signal $V_{DET}$ will change and can be detected by the logic circuit 122a.

In practical applications, the power impedance matching circuit 121a may not be connected to either the positive output terminal Ta or the negative output terminal Tb (for example, connecting the power impedance matching circuit 121a to a constant voltage different from the output voltage Vout), as long as the voltage detection signal $V_{DET}$ generated by the power impedance matching circuit 121a can make the logic circuit 122a obtain the disconnected status of the system connection terminal DETb and the system detection terminal DETa, and as long as the logic circuit 122a can distinguish the voltage variance of the voltage detection signal $V_{DET}$ for determining whether the system connection terminal DETb and the system detection terminal DETa are connected or not. In still another embodiment, the power impedance matching circuit 121a may comprise a resistance circuit or a voltage divider circuit composed of a plurality of second resistive elements.

The logic circuit 122a comprises a comparator CMP and a drive circuit DRV. The comparator CMP respectively receives the voltage detection signal $V_{DET}$ and the reference signal Vref for generating the connection status signal CS. In FIG. 4, the positive input terminal (+) of the comparator CMP receives the voltage detection signal $V_{DET}$, and the negative input terminal (−) of the comparator CMP receives the reference signal Vref, but the instant disclosure is not so restricted. The manner of inputting signals to the comparator CMP can be changed according to the design of the logic circuit 122a.

The drive circuit DRV is coupled to the comparator CMP and converts the connection status signal CS generated by the comparator CMP to a drive signal CS' and provides the drive signal CS' to a control chip (for example the control IC 113 shown in FIG. 4) of the power supply unit 11, thereby determining whether to switch the operation of the external power supply 1a from the deep sleeping mode to the normal operation mode accordingly. The drive signal CS' and the connection signal CS can be the same. In practical applications, the drive signal CS' can replace the connection signal CS to be the signal source of driving control. In practical applications, the drive signal CS' of the drive circuit DRV can be adjusted according to the circuit design. In this embodiment, the drive circuit DRV can be a control chip or circuit independent from the control IC 113, but the instant disclosure is not restricted thereto.

In still another embodiment, the drive circuit DRV can be incorporated into the control IC 113 of the power supply unit 11, so as to obtain a single control chip. That is, the logic circuit 122a directly compares the voltage detection signal $V_{DET}$ and the reference signal Vref to generate the connection status signal CS, and the logic circuit 122a provides the connection status signal CS to a control chip (which is the control IC 113 shown in FIG. 4) of the power supply unit 11, thereby determining whether to switch the operation of the external power supply 1a from the deep sleeping mode to the normal operation mode accordingly.

Figure 5:
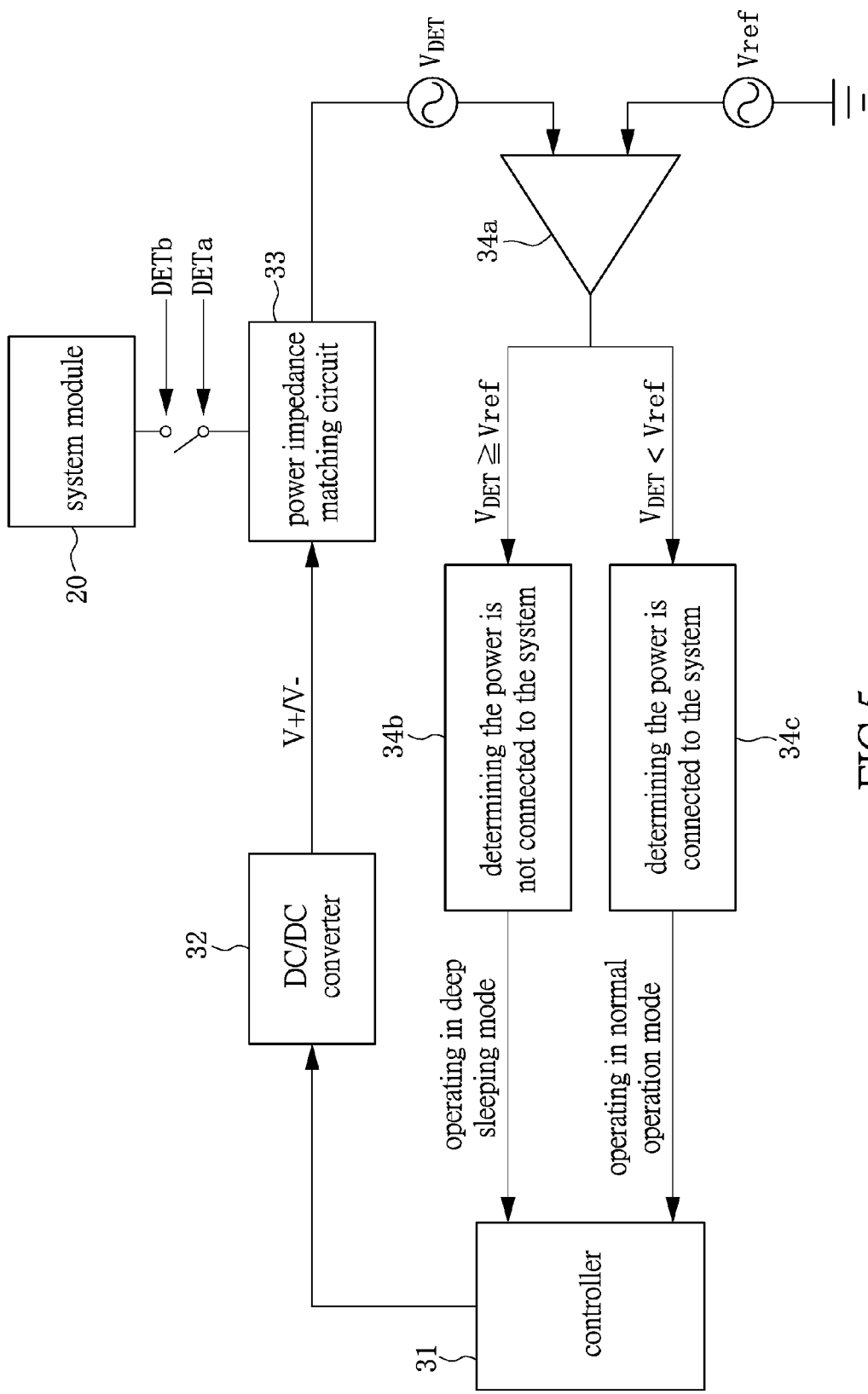
FIG. 5 shows a functional block diagram of the circuit block diagram of FIG. 4.

Please refer to FIG. 4 in conjunction with FIG. 5. FIG. 5 shows a functional block diagram of the circuit block diagram of FIG. 4. Based on the functional block diagram of FIG. 5, the power impedance matching circuit 121a and the logic circuit 122a of the external power supply 1a may have a variety of embodiments, and are not limited to the circuit shown in FIG. 4. As shown in FIG. 5, the controller 31 controls the DC/DC converter 32. The controller 31 corresponds to the control IC 113 shown in FIG. 4. The DC/DC converter 32 corresponds to the DC/DC converter 112 shown in FIG. 4. The power impedance matching circuit 33 can receive the voltage of the positive output terminal Ta (V+) or that of the negative output terminal Tb (V−) through at least one second resistive element Rd. The power impedance matching circuit 121a shown in FIG. 4 receives the voltage of the positive output terminal Ta (V+) through the second resistive element Rd. According to the voltage detection signal $V_{DET}$ corresponding to the connection status of the system connection terminal DETb and the system detection terminal DETa, the logic blocks 34a, 34b, 34c determine whether to switch the external power supply 1a from the deep sleeping mode to the normal operation mode. The logic block 34a compares the voltage detection signal $V_{DET}$ with the reference signal Vref. When the voltage detection signal $V_{DET}$ is larger than or equal to the reference signal Vref, the logic block 34b determines that the power source is not connected to the system, so as to inform the controller 31 to operate in the deep sleeping mode. Otherwise, when the voltage detection signal $V_{DET}$ is less than the reference signal Vref, the logic block 34c determines that the power source is connected to the system, so as to inform the controller 31 to operate in the normal operation mode.

[Another Embodiment of an External Power Supply and a System Connection Detection Unit Applied Thereto]

Figure 6:
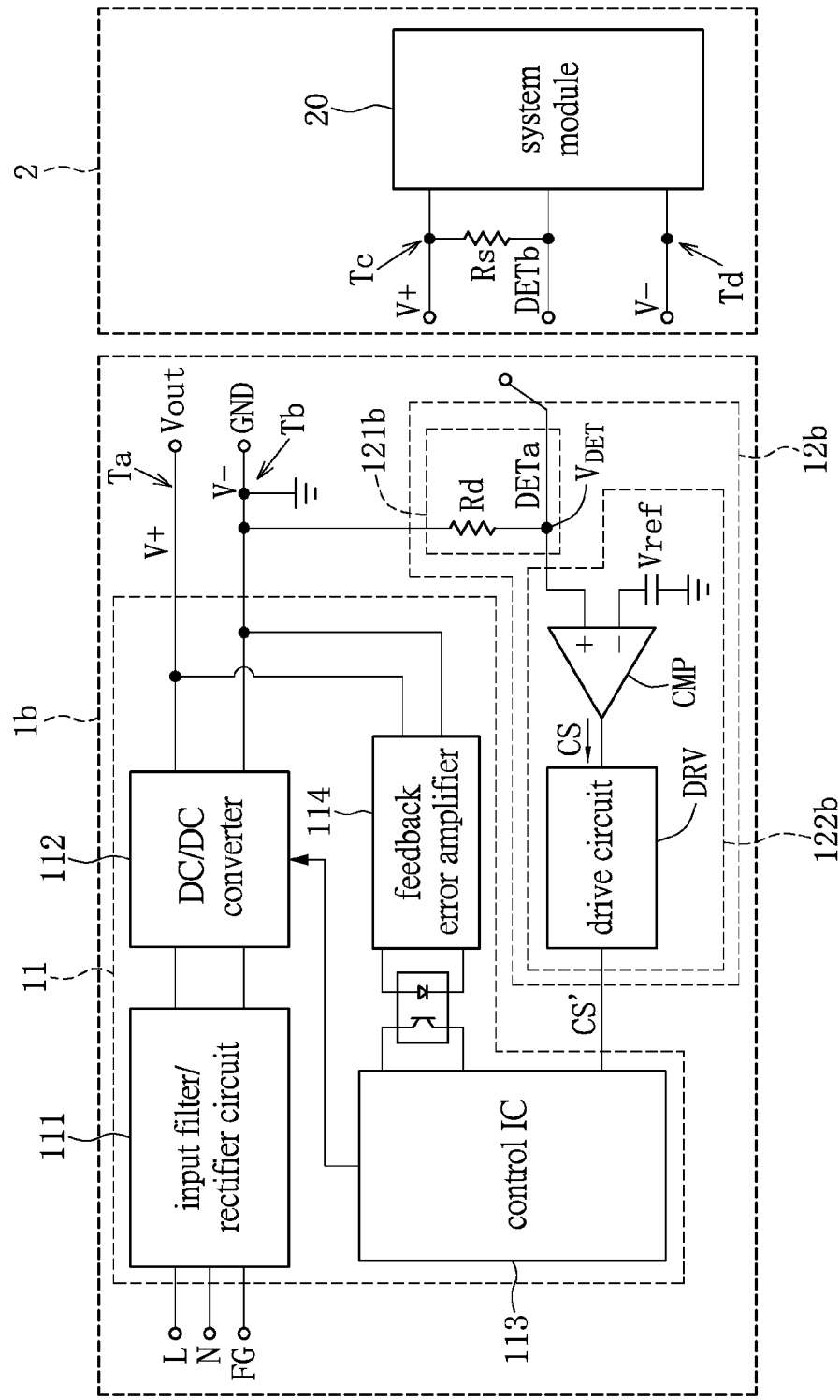
FIG. 6 shows a circuit block diagram of an external power supply and the connected system according to another embodiment of the instant disclosure.

Please refer to FIG. 6 showing a circuit block diagram of an external power supply and the connected system according to another embodiment of the instant disclosure. The power supply unit 11 of the external power supply 1b shown in FIG. 6 is the same as to the power supply 11 of the external power supply 1 shown in FIG. 3. FIG. 6 further shows another embodiment of the system connection detection unit. The system connection detection unit 12b comprises a power impedance matching circuit 121b and a logic circuit 122b.

As shown in FIG. 6, the power impedance matching circuit 121b comprises a second resistive element Rd. The circuit of FIG. 6 is essentially identical to that of FIG. 4 except for difference that the power impedance matching circuit 121a is replaced by the power impedance matching circuit 121b. The first resistive element Rs connected to the system connection terminal DETb is changed to connect to the positive input terminal Tc, and the system connection terminal DETb is not connected to the negative input terminal Td. In other words, the system detection terminal DETa is electrically connected to the negative output terminal Tb through the second resistive element Rd, and the system connection terminal DETb is electrically connected to the positive input terminal Tc of the system through the first resistive element Rs.

The power impedance matching circuit 121b uses the second resistive element Rd to hold a voltage status (V−, that is the ground GND), such that the voltage detection signal $V_{DET}$ is fixed (the situation shown in FIG. 4 is the so called pull-low). In another embodiment, the power impedance matching circuit 121b may comprise a resistance circuit or a voltage divider circuit composed of a plurality of second resistive elements.

The logic circuit 122b comprises a comparator CMP and a drive circuit DRV. The comparator CMP respectively receives the voltage detection signal $V_{DET}$ and the reference signal Vref for generating the connection status signal CS. In FIG. 6, the positive input terminal (+) of the comparator CMP receives the voltage detection signal $V_{DET}$, and the negative input terminal (−) of the comparator CMP receives the reference signal Vref, but the instant disclosure is not so restricted. The manner of inputting signals to the comparator CMP can be changed according to the design of the logic circuit 122b.

The drive circuit DRV is coupled to the comparator CMP and converts the connection status signal CS generated by the comparator CMP to a drive signal CS' and provides the drive signal CS' to a control chip (for example the control IC 113 shown in FIG. 6) of the power supply unit 11, thereby determining whether to switch the operation of the external power supply 1b from the deep sleeping mode to the normal operation mode accordingly.

In this embodiment, the drive circuit DRV may be a control chip or circuit independent from the control IC 113, but the instant disclosure is not restricted thereto. In still another embodiment, the drive circuit DRV can be incorporated into the control IC 113 of the power supply unit 11, so as to obtain a single control chip. That is, the logic circuit 122b directly compares the voltage detection signal $V_{DET}$ with the reference signal Vref to generate the connection status signal CS, and the logic circuit 122b provides the connection status signal CS to a control chip (which is the control IC 113 shown in FIG. 6) of the power supply unit 11, thereby determining whether to switch the operation of the external power supply 1b from the deep sleeping mode to the normal operation mode accordingly.

Figure 7:
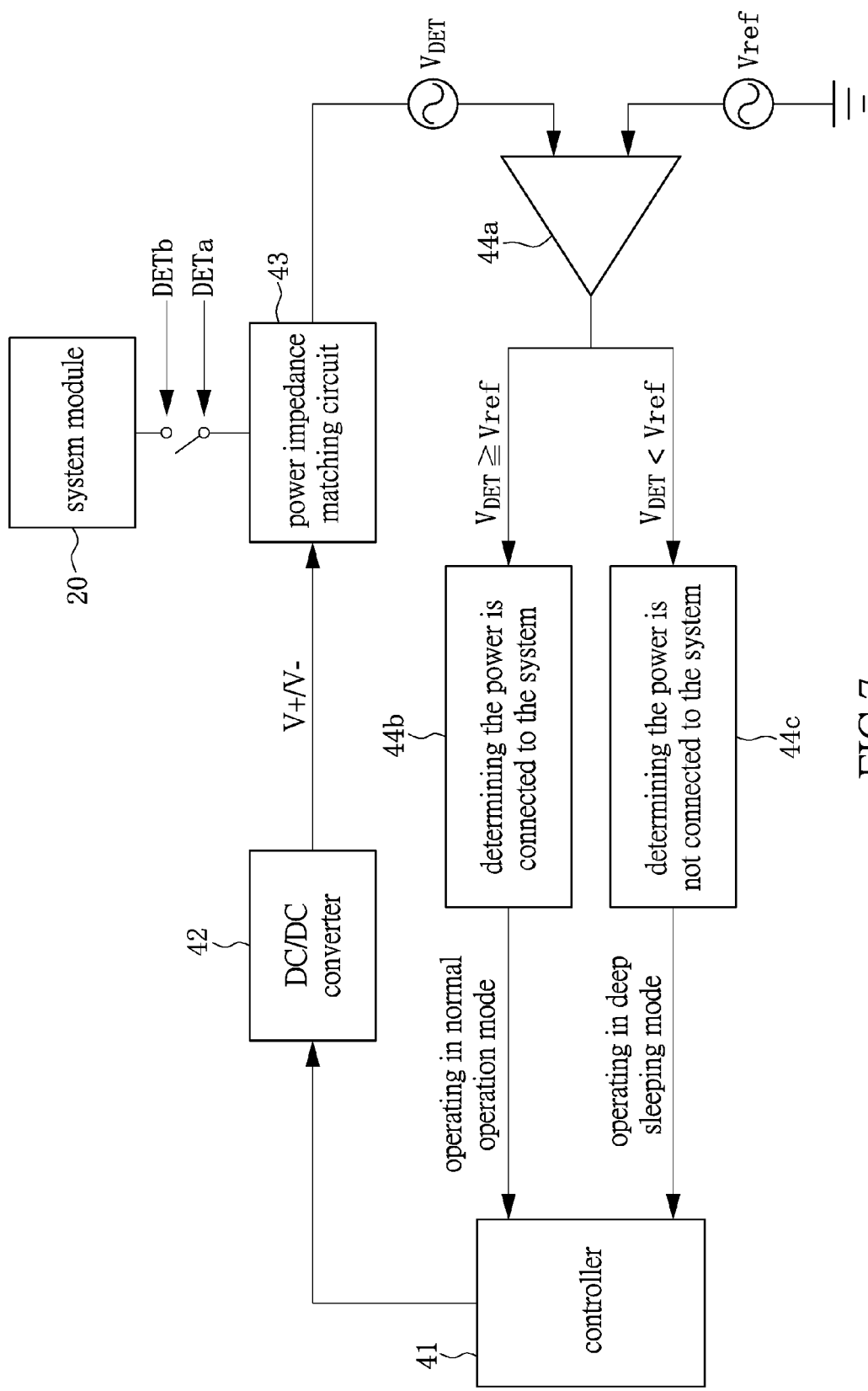
FIG. 7 shows a functional block diagram of the circuit block diagram of FIG. 6.

Please refer to FIG. 6 in conjunction with FIG. 7. FIG. 7 shows a functional block diagram of the circuit block diagram of FIG. 6. Based on the functional block diagram of FIG. 6, the power impedance matching circuit 121b and the logic circuit 122b of the external power supply 1b may have a variety of embodiments and are not limited to the circuit shown in FIG. 6. As shown in FIG. 7, the controller 41 controls the DC/DC converter 42. The controller 41 corresponds to the control IC 113 shown in FIG. 6. The DC/DC converter 42 corresponds to the DC/DC converter 112 shown in FIG. 6. The power impedance matching circuit 43 can receive the voltage of the positive output terminal Ta (V+) or the voltage of the negative output terminal Tb (V−) through at least one second resistive element. The power impedance matching circuit 121b shown in FIG. 6 receives the voltage of the negative output terminal Tb (V−) through the second resistive element Rd. According to the voltage detection signal $V_{DET}$ corresponding to the connection status of the system connection terminal DETb and the system detection terminal DETa, the logic blocks 44a, 44b, 44c determine whether to switch the external power supply 1b from deep sleeping mode to the normal operation mode. The logic block 44a compares the voltage detection signal $V_{DET}$ with the reference signal Vref. When the voltage detection signal $V_{DET}$ is larger than or equal to the reference signal Vref, the logic block 44b determines that the power source is connected to the system, so as to inform the controller 41 to operate in normal operation mode. Otherwise, when the voltage detection signal $V_{DET}$ is less than the reference signal Vref, the logic block 44c determines that the power source is not connected to the system, so as to inform the controller 41 to operate in the deep sleeping mode.

According to above descriptions, the provided external power supply and the system connection detection unit applied thereto make the system connection detection unit detect the input signal of the system (the voltage detection signal) by using a voltage detection method. Also, a logic circuit judgment method is used to adjust the operation mode of the power supply. When no system is connected, the external power supply enters the deep sleeping mode, in order to achieve extreme low power consumption to fit in with international energy rules. When the external power supply is connected to the system, the external power supply returns to the normal operation mode, to provide a stable constant DC voltage output, in order to solve the load abnormal operation problem due to the voltage being too low resulting from that the power supply is not fast enough to recover the normal operation mode when the load draw happens. Therefore, the provided external power supply can be applied to a computer system (a desktop computer for example) without battery, a display or TV and so on.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. An external power supply, separably connecting with a positive input terminal and a negative input terminal of a system through a positive output terminal and a negative output terminal respectively for providing electrical power to the system, comprising:
    a power supply unit, electrically connected to the positive output terminal and the negative output terminal; and
    a system connection detection unit, electrically connected to the power supply unit for detecting the connecting status between the external power supply and the system, and having a system detection terminal which is used to connect with a system connection terminal of the system when the positive output terminal and the negative output terminal respectively connecting to the positive input terminal and the negative input terminal of the system, wherein the system connection terminal is electrically connected to one of the positive input terminal and the negative input terminal through at least one first resistive element;
    wherein the system connection detection unit detects the voltage of the system detection terminal and generates a connection status signal accordingly, and the connection status signal generated by the system connection detection unit switches the operation of the external power supply from a deep sleeping mode to a normal operation mode when the positive output terminal and the negative output terminal are respectively connecting to the positive input terminal and the negative input terminal of the system.

2. The external power supply according to claim 1, wherein the system connection detection unit comprises:
a power impedance matching circuit, electrically connected with the system detection terminal, generating a voltage detection signal according to the voltage of the system detection terminal; and
a logic circuit, electrically connected to the power impedance matching circuit, the logic circuit comparing the voltage detection signal with a reference signal to generate the connection status signal, wherein the voltage of the reference signal is between the voltage of the positive output terminal and the voltage of the negative output terminal.

3. The external power supply according to claim 2, wherein the logic circuit comprises:
a comparator, respectively receiving the voltage detection signal and the reference signal for generating the connection status signal; and
a drive circuit, coupled to the comparator, converting the connection status signal generated by the comparator to a drive signal and providing the drive signal to a control chip of the power supply unit, thereby determining whether to switch the operation of the external power supply from the deep sleeping mode to the normal operation mode accordingly.

4. The external power supply according to claim 2, wherein the system connection terminal is electrically connected to the positive input terminal of the system through the first resistive element, the power impedance matching circuit has at least one second resistive element, the system detection terminal is electrically connected to the negative output terminal through at least one second resistive element.

5. The external power supply according to claim 2, wherein the system connection terminal is electrically connected to the negative input terminal of the system through the first resistive element, the power impedance matching circuit has at least one second resistive element, the system detection terminal is electrically connected to the positive output terminal through at least one second resistive element.

6. A system connection detection unit applied to an external power supply, electrically connected to a power supply unit of the external power supply for detecting the connecting status between the external power supply and a system, the external power supply separably connected with a positive input terminal and a negative input terminal of the system respectively through a positive output terminal and a negative output terminal for providing electrical power to the system, the power supply unit electrically connected to the positive output terminal and the negative output terminal, the system connection detection unit having a system detection terminal which is used to connect with a system connection terminal of the system when the positive output terminal and the negative output terminal respectively connecting to the positive input terminal and the negative input terminal of the system, wherein the system connection terminal is electrically connected to one of the positive input terminal and the negative input terminal through at least one first resistive element;
wherein the system connection detection unit detects the voltage of the system detection terminal and generates a connection status signal accordingly, and the connection status signal generated by the system connection detection unit switches the operation of the external power supply from a deep sleeping mode to a normal operation mode when the positive output terminal and the negative output terminal are respectively connecting to the positive input terminal and the negative input terminal of the system.

7. The system connection detection unit according to claim 6, wherein the system connection detection unit comprises:
a power impedance matching circuit, electrically connected with the system detection terminal, generating a voltage detection signal according to the voltage of the system detection terminal; and
a logic circuit, electrically connected to the power impedance matching circuit, the logic circuit comparing the voltage detection signal with a reference signal to generate the connection status signal, wherein the voltage of the reference signal is between the voltage of the positive output terminal and the voltage of the negative output terminal.

8. The system connection detection unit according to claim 7, wherein the logic circuit comprises:
a comparator, respectively receiving the voltage detection signal and the reference signal for generating the connection status signal; and
a drive circuit, coupled to the comparator, converting the connection status signal generated by the comparator to a drive signal and providing the drive signal to a control chip of the power supply unit of the external power supply, for determining whether to switch the operation of the external power supply from the deep sleeping mode to the normal operation mode accordingly.

9. The system connection detection unit according to claim 7, wherein the system connection terminal is electrically connected to the positive input terminal of the system through the first resistive element, the power impedance matching circuit has at least one second resistive element, and the system detection terminal is electrically connected to the negative output terminal through at least one second resistive element.

10. The system connection detection unit according to claim 7, wherein the system connection terminal is electrically connected to the negative input terminal of the system through the first resistive element, the power impedance matching circuit has at least one second resistive element, and the system detection terminal is electrically connected to the positive output terminal through at least one second resistive element.

* * * * *